(12) United States Patent
Park et al.

(10) Patent No.: US 12,736,594 B2
(45) **Date of Patent: *Sep. 15, 2026**

(54) APPARATUS AND METHOD FOR MEASURING ELECTRODE LOSS USING REFERENCE POINT, AND ROLL MAP OF ELECTRODE PROCESS WITH REFERENCE POINT DISPLAYED AND METHOD AND SYSTEM FOR GENERATING THE SAME

(71) Applicant: LG Energy Solution, Ltd., Seoul (KR)

(72) Inventors: Su Wan Park, Daejeon (KR); Jong Seok Park, Daejeon (KR); Dong Yeop Lee, Daejeon (KR); Jun Hyo Su, Daejeon (KR); Ki Deok Han, Daejeon (KR); Byoung Eun Han, Daejeon (KR); Seung Huh, Daejeon (KR); Gi Yeong Jeon, Daejeon (KR); Jae Hwan Lee, Daejeon (KR); Min Su Kim, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 955 days.

This patent is subject to a terminal disclaimer.

(21) Appl. No.: 17/944,697

(22) Filed: Sep. 14, 2022

(65) Prior Publication Data

US 2023/0109490 A1 Apr. 6, 2023

(30) Foreign Application Priority Data

Aug. 5, 2021 (KR) ........................ 10-2021-0103393

(51) Int. Cl.

| | |
|---|---|
| ***G01R 31/52*** | (2020.01) |
| ***H01M 4/04*** | (2006.01) |
| ***H01M 4/139*** | (2010.01) |

(52) U.S. Cl.
CPC .......... *G01R 31/52* (2020.01); *H01M 4/0402* (2013.01); *H01M 4/0435* (2013.01); *H01M 4/139* (2013.01)

(58) Field of Classification Search
CPC .. G01R 31/52; H01M 4/0402; H01M 4/0435; H01M 4/139; H01M 4/0404; G01B 11/02; G01B 5/02; Y02E 60/10; Y02P 70/50
See application file for complete search history.

(56) References Cited

U.S. PATENT DOCUMENTS

2016/0179285 A1* 6/2016 Lee ........................ G06F 3/0445 345/174
2018/0277854 A1 9/2018 Narita et al.
(Continued)

FOREIGN PATENT DOCUMENTS

CN 109449377 A 3/2019
JP H10137672 A 5/1998
(Continued)

*Primary Examiner* — Jennifer Wecker
*Assistant Examiner* — Jonathan Bortoli
(74) *Attorney, Agent, or Firm* — Bryan Cave Leighton Paisner LLP

(57) ABSTRACT

An electrode loss measuring apparatus includes an electrode which moves in a roll-to-roll state between an unwinder and a rewinder and on which a plurality of reference points are marked at predetermined intervals. The apparatus further includes a reference point detector configured to detect the reference points marked on the electrode, a position measurer configured to derive a position value of the electrode according to a rotation amount of the unwinder or the rewinder, and a position value of the corresponding reference point in conjunction with the reference point detector when the reference point detector detects the reference point, and a calculator configured to calculate a loss amount of the electrode by comparing the derived position value of the (Continued)

reference point with a position value of a set reference point when an interval between the reference points is changed due to a loss of a portion of the electrode.

12 Claims, 11 Drawing Sheets

(56) References Cited

U.S. PATENT DOCUMENTS

| | | | |
|---|---|---|---|
| 2023/0097728 | A1 | 3/2023 | Huh et al. |
| 2023/0349834 | A1 | 11/2023 | Choi et al. |

FOREIGN PATENT DOCUMENTS

| | | | |
|---|---|---|---|
| JP | 2014-83801 | A | 5/2014 |
| JP | 2015-159015 | A | 9/2015 |
| JP | 6119188 | B2 | 4/2017 |
| JP | 2018-156915 | A | 10/2018 |
| JP | 6465914 | B2 | 2/2019 |
| JP | 6713278 | B2 | 6/2020 |
| KR | 101182956 | B1 | 9/2012 |
| KR | 10-2013-0025958 | A | 3/2013 |
| KR | 10-2043024 | B1 | 11/2019 |
| KR | 10-2206908 | B1 | 1/2021 |
| KR | 20210066757 | A | 6/2021 |

* cited by examiner

【FIG. 1】
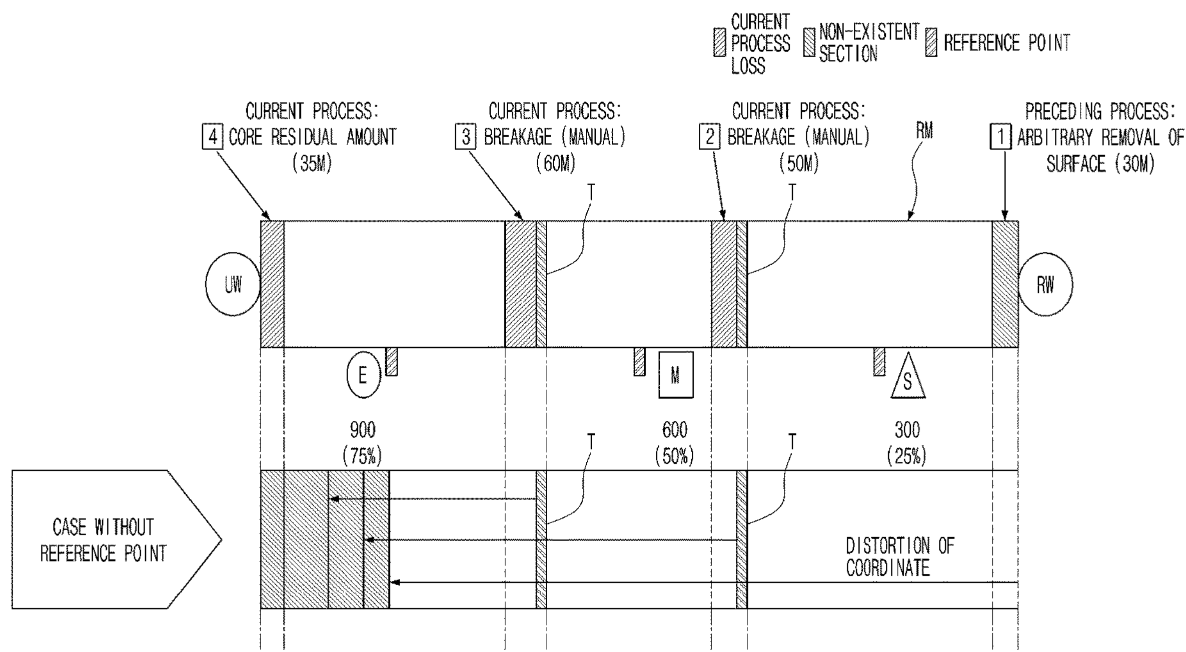

【FIG. 2】
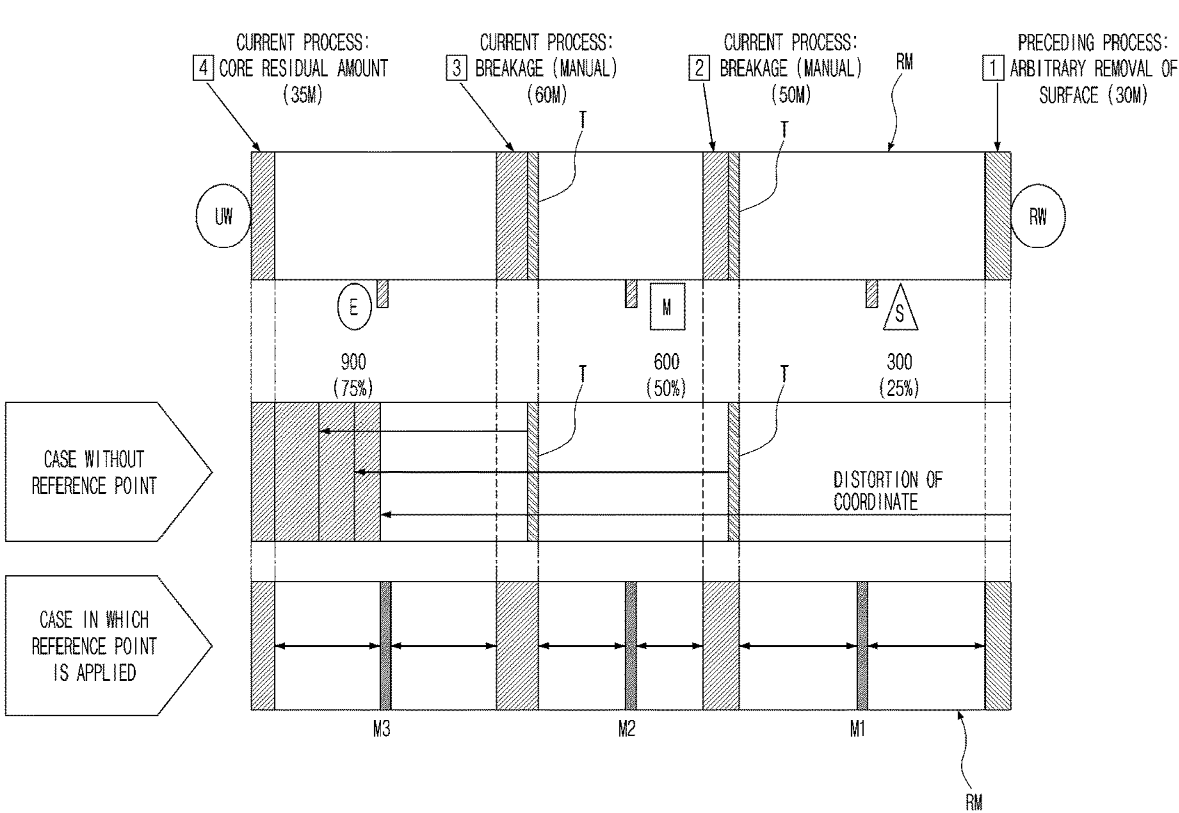

【FIG. 3】
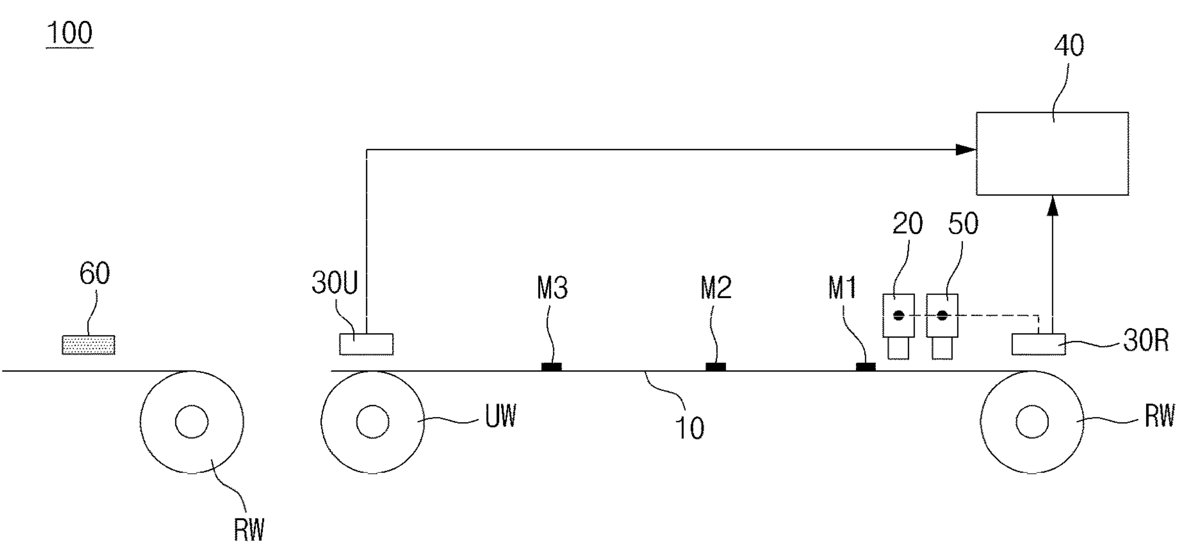

【FIG. 4】
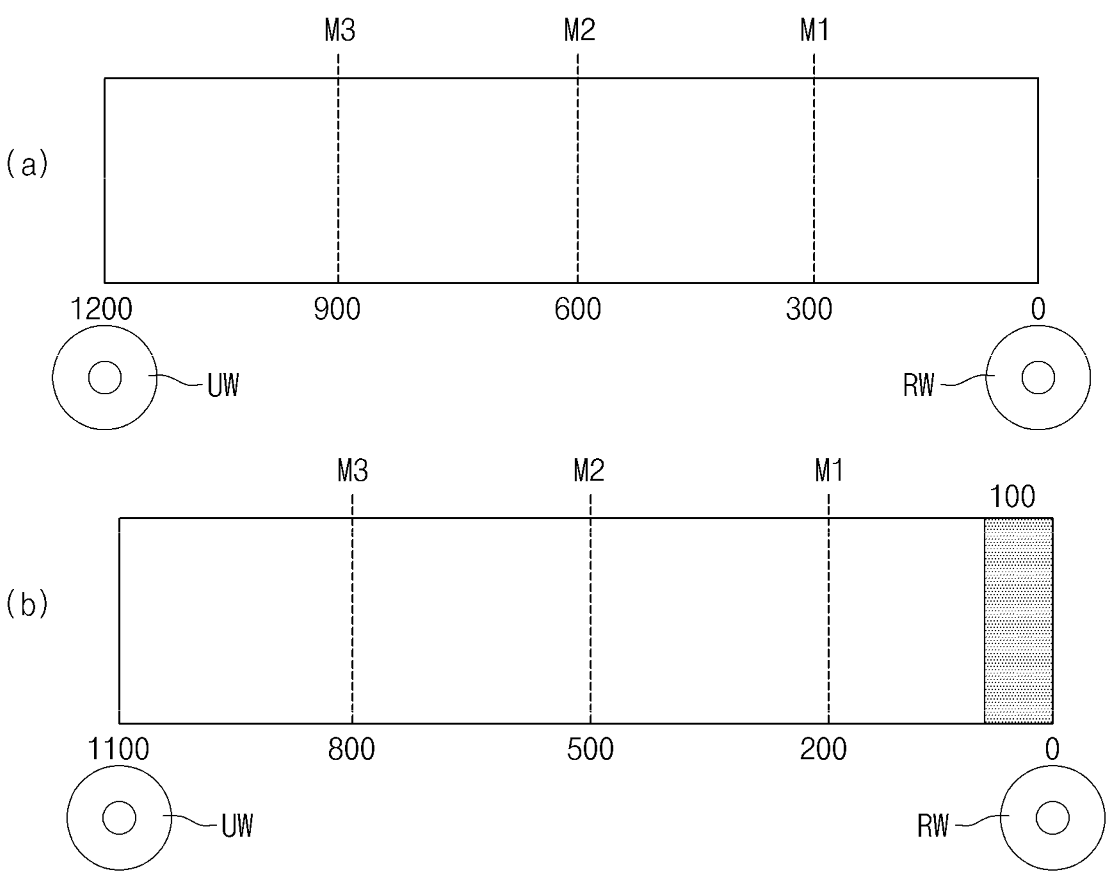

【FIG. 5】
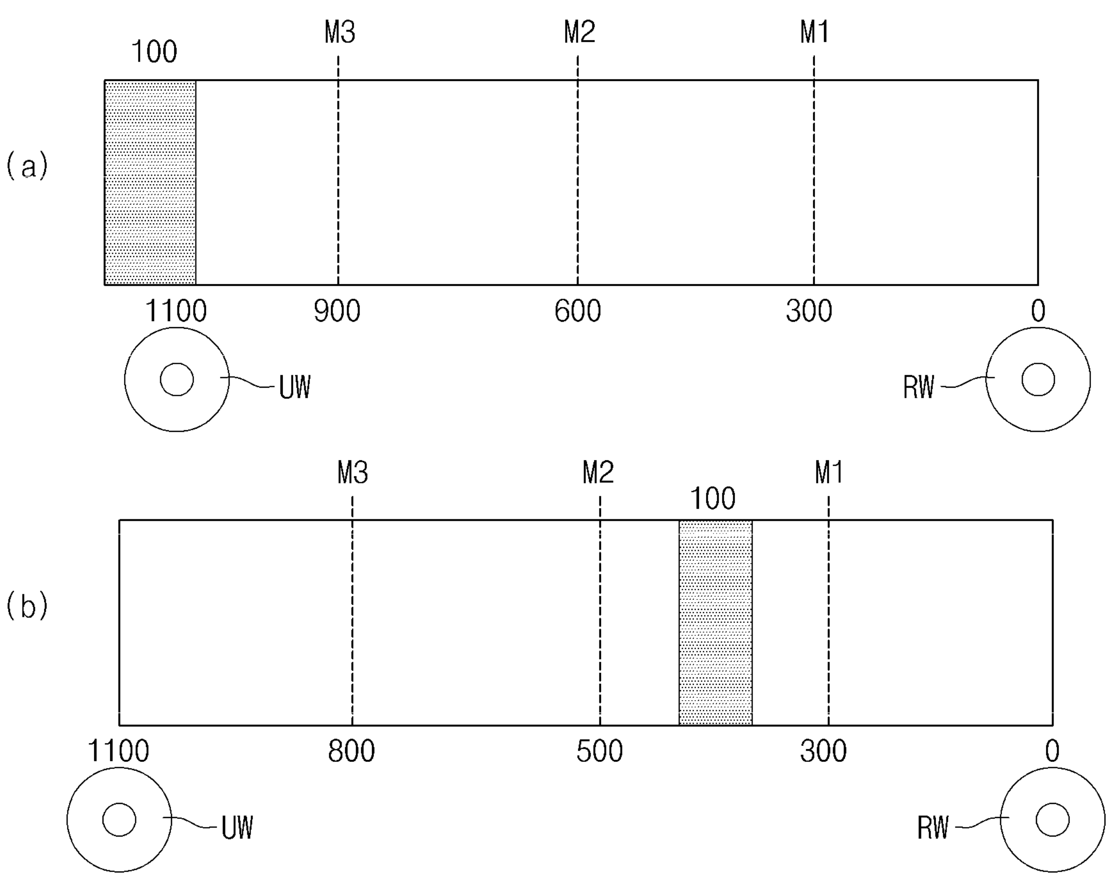

【FIG. 6】
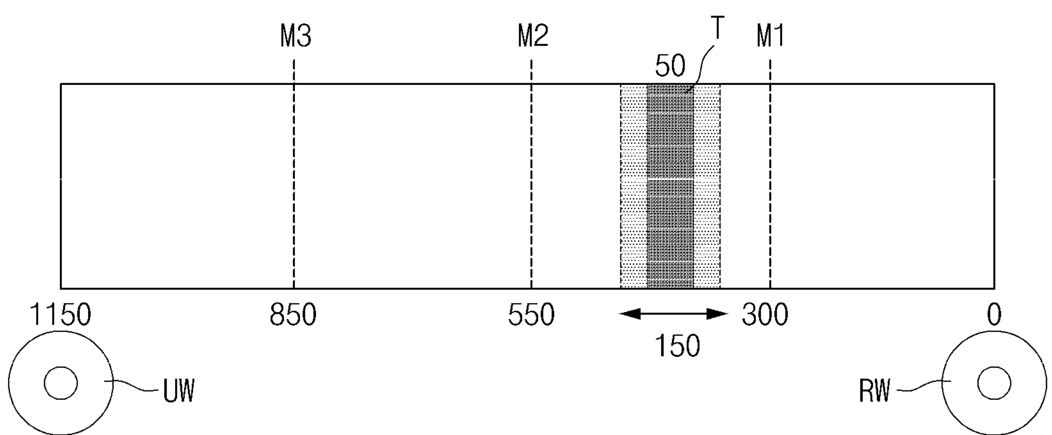

【FIG. 7】
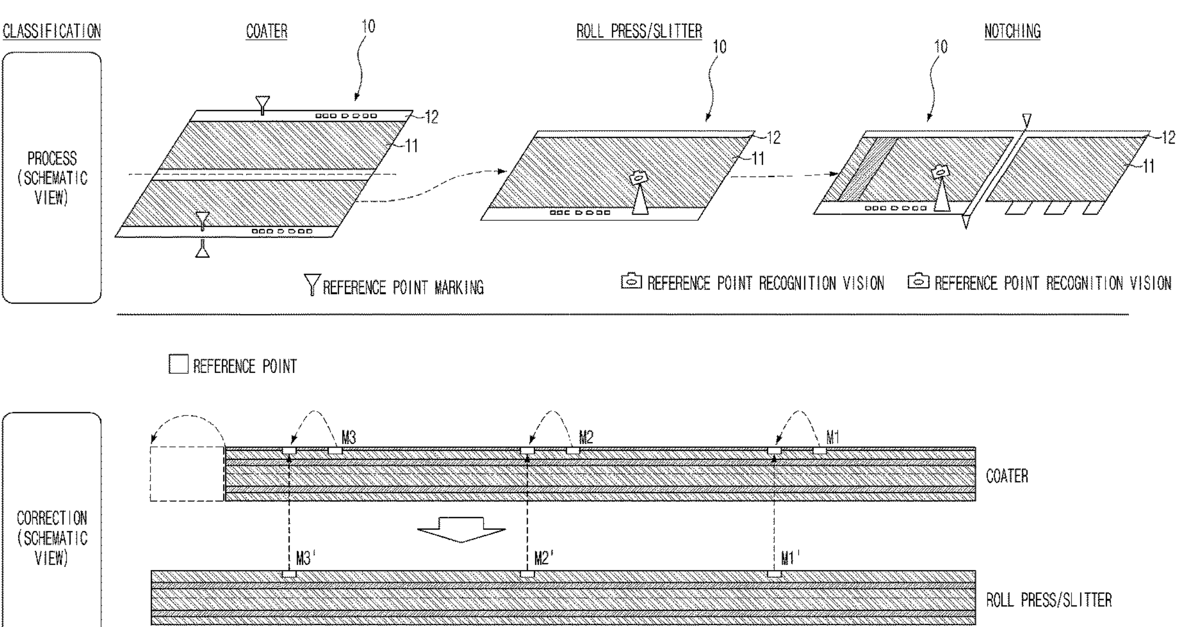

【FIG. 8】
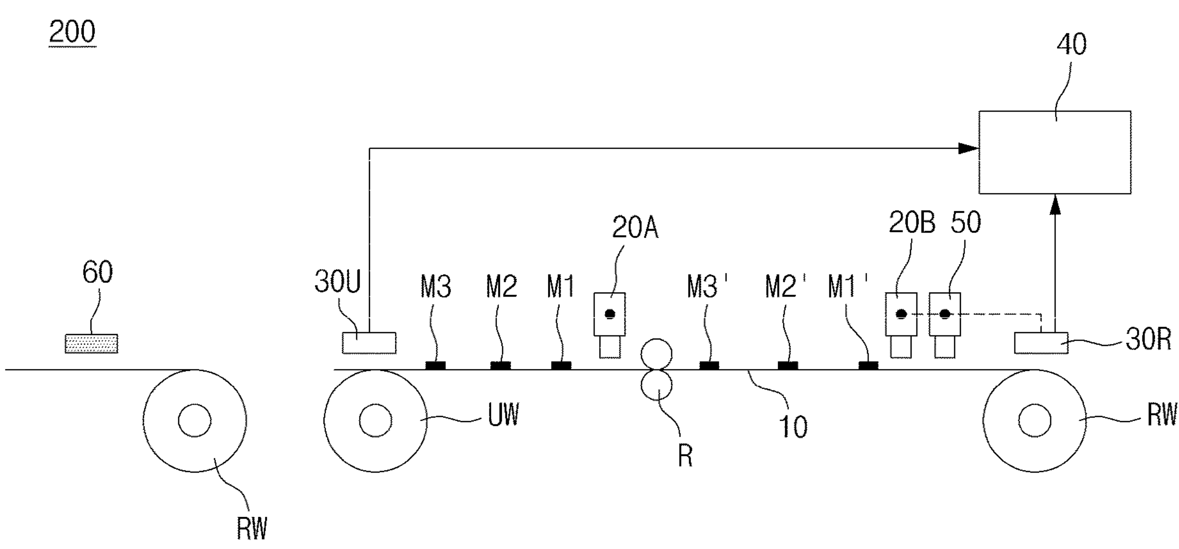

【FIG. 9】
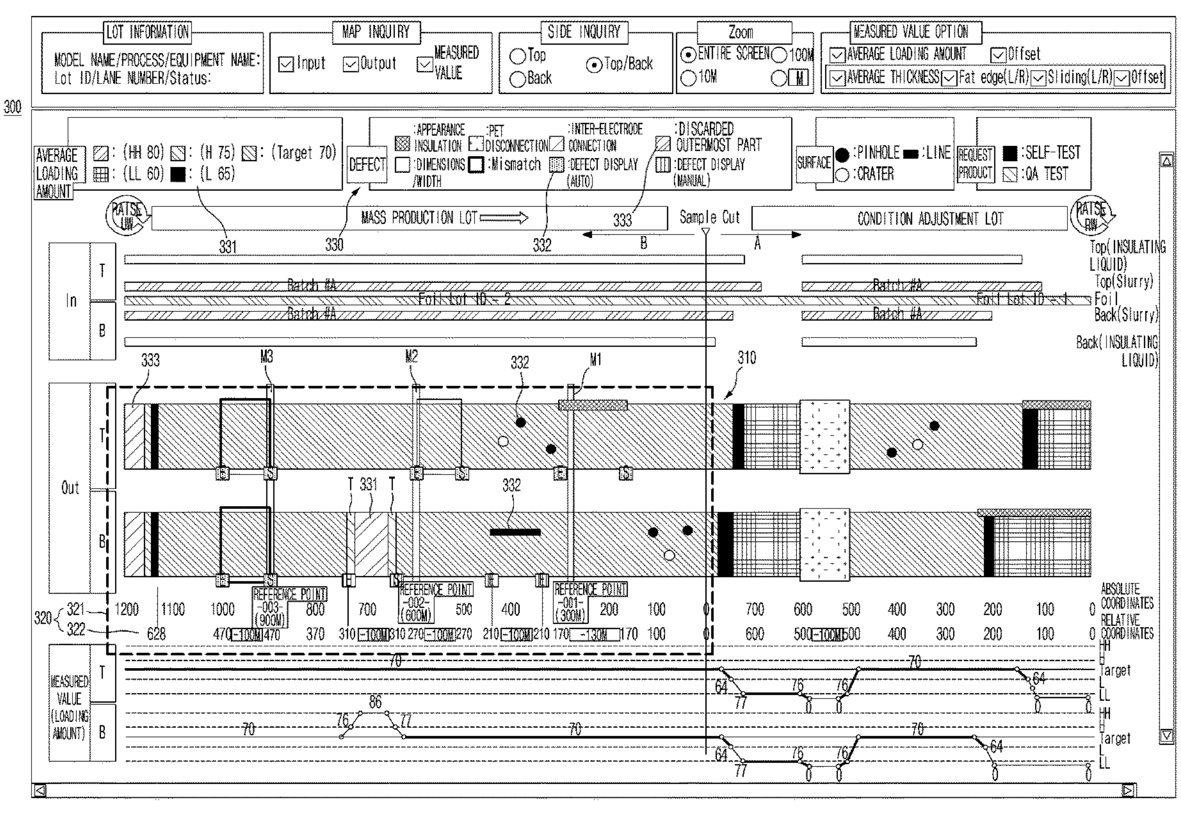

【FIG. 10】
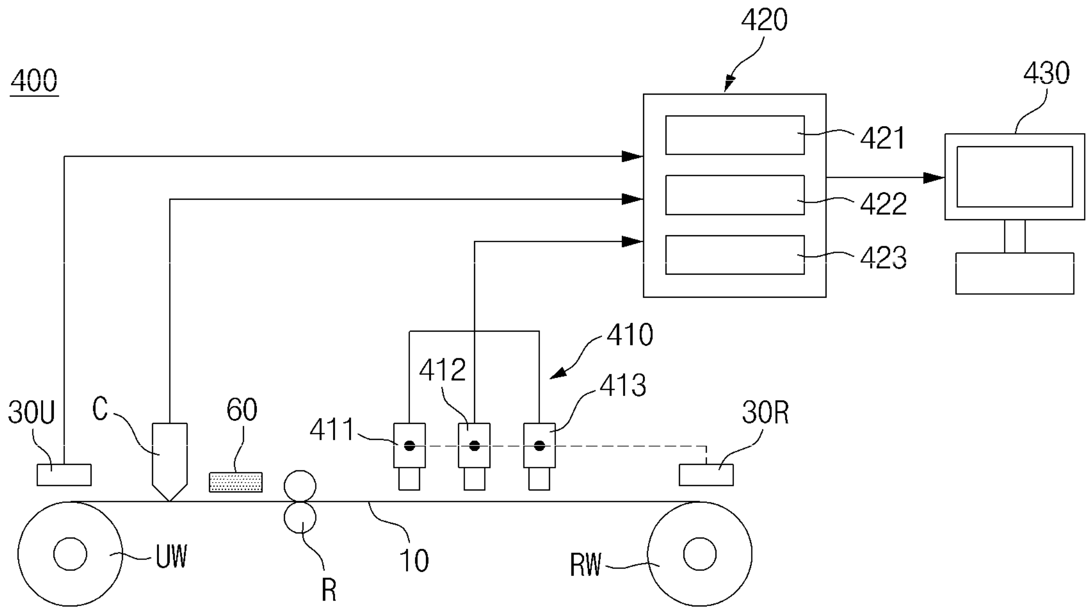

【FIG. 11】
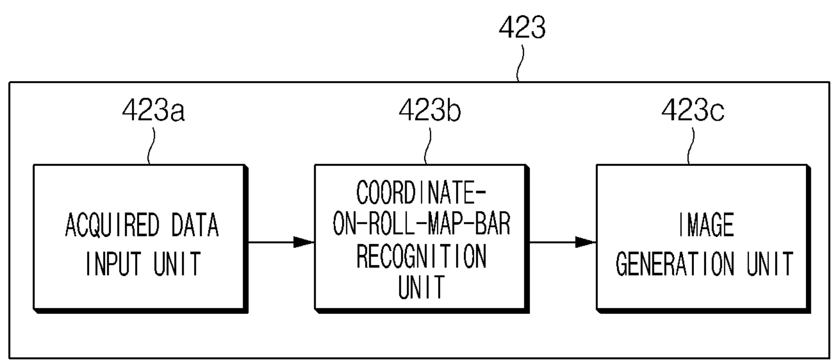

APPARATUS AND METHOD FOR MEASURING ELECTRODE LOSS USING REFERENCE POINT, AND ROLL MAP OF ELECTRODE PROCESS WITH REFERENCE POINT DISPLAYED AND METHOD AND SYSTEM FOR GENERATING THE SAME

CROSS-REFERENCE TO RELATED APPLICATION

This application claims priority to and the benefit of Korean Patent Application No. 10-2021-0103393, filed on Aug. 5, 2021, the disclosure of which is incorporated herein by reference in its entirety.

BACKGROUND

1. Field of the Invention

The present disclosure relates to an apparatus and method for measuring an electrode loss in an electrode process in which an electrode is manufactured by electrode coating, roll press, and slitting. More particularly, the present disclosure relates to an electrode loss measuring apparatus and method capable of easily measuring an electrode loss by marking a reference point on an electrode.

The present disclosure also relates to a bar-type roll map simulating electrode movement, and more particularly, to a roll map of an electrode process, on which reference points are displayed.

The present disclosure also relates to a system and method for generating a roll map of the electrode process.

2. Discussion of Related Art

With the increase in technology development and demand for mobile devices, the demand for secondary batteries is also rapidly increasing. Among them, lithium secondary batteries are widely used as energy sources for various electronic products as well as various mobile devices because of their high energy density and operating voltage and excellent storage and lifespan characteristics.

A so-called electrode process of manufacturing an electrode of a lithium secondary battery includes a coating process of forming a positive electrode and a negative electrode by applying an active material and a predetermined insulating material to a surface of a metal electrode plate which is a current collector, a roll press process of rolling the coated electrode, and a slitting process of cutting the rolled electrode according to dimensions.

In the electrode manufactured in the electrode process, an electrode tab is formed by a notching process, a separator is interposed between the positive electrode and the negative electrode to form an electrode assembly, and then a secondary battery is formed through an assembly process of stacking or folding the electrode assembly, packaging the electrode assembly in a pouch or can, and injecting an electrolyte into the pouch or can. Thereafter, the assembled secondary battery undergoes an activation process of imparting battery characteristics through charging and discharging to become a secondary battery that is a final finished product.

When breakage or defects occur in the electrode in the electrode process, there is a case in which the broken or defective portion is removed and the broken electrodes are connected with a connection tape. Alternatively, there is a case in which a starting end portion or a finishing end portion of the electrode, which has non-uniform electrode quality, is removed to maintain the quality of the electrode. In this case, after removing and connecting the electrode, an operator arbitrarily inputs a length (a loss amount of the electrode or an electrode loss) of the cut electrode to a controller or the like. However, since the operator manually measures the loss amount of the electrode with the naked eye or a measuring tool such as a ruler and inputs the loss amount of the electrode, in practice, the consumed loss amount of the electrode is not accurate. In addition, the loss amounts of the electrode, which are input for each operator, are different.

In this case, in a subsequent process, the fact that the electrode was broken and connected may be confirmed by detecting the connection tape, but the loss amount of the electrode may not be accurately identified because the loss amount of the electrode depends on the operator's input. When the cut loss amount of the electrode is not accurate, a position coordinate of the electrode in the subsequent process is changed, and thus it may be difficult to accurately perform a subsequent processing process at a desired position. In addition, since a criterion for comparing and analyzing quality changes between each detailed process of the electrode process depends on the loss amount of the electrode, quality comparison according to the position of the electrode may not be reliably performed.

Further, recently, a roll map has been used in which data related to quality or defects is displayed on a roll map bar that is displayed on a screen by simulating an electrode in a roll-to-roll state. Since such a roll map is generated in each detailed electrode process of a coating process, a roll press process, and a slitting process, roll map information is downloaded, and information on the quality failure or the electrode breakage in the preceding process is checked in the subsequent process to remove defects or take necessary follow-up processing. However, when the loss amount of the electrode is not accurately identified as described above, data on the position of the electrode displayed on the roll map is changed, and thus, the data related to the quality or a defect position may not be accurately displayed, and when the roll map is referenced in the subsequent process, there is a risk of performing the subsequent process on the basis of incorrect position coordinates.

Accordingly, in the electrode process, the development of technology capable of accurately measuring the loss amount of the electrode is desired.

SUMMARY OF THE INVENTION

The present disclosure is directed to providing an electrode loss measuring apparatus and method capable of automatically and accurately identifying an electrode loss in an electrode process by introducing a reference point.

The present disclosure is also directed to providing a roll map of an electrode process, on which the reference point is displayed.

The present disclosure is also directed to providing a system and method for generating the roll map of the electrode process.

According to an aspect of the present disclosure, there is provided an electrode loss measuring apparatus including an electrode which moves in a roll-to-roll state between an unwinder and a rewinder and on which a plurality of reference points are marked at predetermined intervals between a starting end portion and a finishing end portion thereof, a reference point detector configured to detect the reference points marked on the electrode, a position measurer configured to derive a position value of the electrode according to a rotation amount of the unwinder or the rewinder, and derive a position value of the corresponding reference point in conjunction with the reference point detector when the reference point detector detects the reference point, and a calculator configured to calculate a loss amount of the electrode by comparing the derived position value of the reference point with a position value of a set reference point when an interval between the reference points between the starting and finishing end portions of the electrode is changed from an interval between the set reference points due to a loss of a portion of the electrode.

As one example, the position measurer may be a rotary encoder configured to extract the position value of the electrode from a rotation amount of a motor that drives the unwinder and the rewinder.

As another example, the electrode loss measuring apparatus may further include a reference point marker installed before the unwinder and configured to mark the plurality of reference points on the electrode at predetermined intervals.

As one example, the electrode loss measuring apparatus may further include a seam detection sensor configured to detect a connection tape attached to the electrode, and the position measurer may derive a length of the connection tape in conjunction with the seam detection sensor when the seam detection sensor detects the connection tape.

Specifically, the calculator may calculate a value obtained by adding the length of the connection tape to the loss amount calculated by comparing the position value of the reference point with the position value of the set reference point as a total loss amount.

As another embodiment of the present disclosure, the electrode loss measuring apparatus may further include a press roll for rolling installed above and below a middle portion of the electrode transferred in a roll-to-roll state, wherein the reference point detector may include a first reference point detector disposed before the press roll and a second reference point detector disposed after the press roll to detect the reference point changed by rolling by the press roll, and the calculator may calculate a loss amount of the electrode before the press roll on the basis of a position value of the reference point detected by the first reference point detector, and calculate a loss amount of the electrode after the rolling by the press roll on the basis of a position value of the changed reference point detected by the second reference point detector.

According to another aspect of the present disclosure, there is provided an electrode loss calculation method including marking a plurality of reference points between a starting end portion and a finishing end portion of an electrode moving in a roll-to-roll state between an unwinder and a rewinder at predetermined intervals, deriving a position value of the reference point by detecting the reference point on the electrode by a reference point detector, and calculating a loss amount of the electrode by comparing the derived position value of the reference point with a position value of a set reference point when an interval between the reference points between the starting and finishing end portions of the electrode is changed from an interval between the set reference points due to a loss of a portion of the electrode.

Specifically, when at least one of the interval between the reference points, an interval between the reference point and the starting end portion of the electrode, and an interval between the reference point and the finishing end portion of the electrode is changed, the loss amount of the electrode may be calculated by comparing the derived position value of the reference point and the position value of the set reference point.

As one example, the electrode loss calculation method may further include detecting a connection tape on the electrode and calculating a length of the connection tape before or after the deriving of the position value of the reference point. Specifically, in the calculating of the loss amount of the electrode, a value obtained by adding the length of the connection tape to the loss amount calculated by comparing the position value of the reference point with the position value of the set reference point may be calculated as a total loss amount.

As another example, when the position of the reference point is changed as the electrode is rolled by a press roll, a loss amount of the rolled electrode may be calculated on the basis of the changed reference point.

According to still another aspect of the present disclosure, there is provided a roll map of an electrode process, the roll map including a roll map bar which is displayed on a screen in synchronization with a movement of an electrode moving in a roll-to-roll state between an unwinder and a rewinder and is displayed in a bar shape by simulating the electrode in a roll-to-roll state, and a plurality of reference points displayed on the roll map bar at predetermined intervals by simulating a plurality of reference points marked between a starting end portion and a finishing end portion of the electrode at predetermined intervals.

As one example, a longitudinal dimension of the electrode may be displayed in a longitudinal direction of the roll map bar, and the displayed reference point may also be displayed as the longitudinal dimension.

At this point, the longitudinal dimension of the electrode may be displayed as an absolute coordinate in which an electrode loss is not reflected and a relative coordinate in which the electrode loss is reflected.

Specifically, the roll map may further include a representation part in which at least one of pieces of data related to quality, defects, and an electrode loss measured in the electrode process is visually displayed at a predetermined position on the roll map bar corresponding to a position of the electrode, at which the at least one of pieces of data is measured.

As one example, the roll map may be a roll map for at least one of an electrode coating process of coating an electrode moving in a roll-to-roll state with an electrode slurry, a roll press process of rolling the electrode by a press roll, and a slitting process of cutting the rolled electrode in a longitudinal direction, and in the roll map of a process after rolling by the press roll, a reference point simulating a position of the reference point changed by the rolling may be displayed on a roll map bar of the roll map.

According to yet another aspect of the present disclosure, there is provided a method of generating a roll map of an electrode process, the method including acquiring data on an electrode loss and data on reference points marked on the electrode by inspecting an electrode moving in a roll-to-roll state between an unwinder, transmitting the acquired data to a data processing system together with data on a position of the electrode, at which the corresponding data is acquired, and displaying a roll map bar in the form of a bar simulating the electrode in a roll-to-roll state on a screen in synchronization with the movement of the electrode between the unwinder and the rewinder and visually displaying the data on the electrode loss and the data on the reference point at a predetermined position of the roll map bar corresponding to the data on the position of the electrode, by the data processing system.

According to yet another aspect of the present disclosure, there is provided a system for generating a roll map of an electrode process, the system including a measuring device configured to inspect an electrode moving in a roll-to-roll state between an unwinder and a rewinder, acquire data on an electrode loss and data on a reference point marked on the electrode, and transmit the pieces of data to a data processing system together with data on a position of the electrode, at which the corresponding data is acquired, the data processing system configured to generate a roll map by displaying a roll map bar in the form of a bar simulating the electrode in a roll-to-roll state in synchronization with the movement of the electrode between the unwinder and the rewinder and visually displaying the transmitted data on the electrode loss and the data on the reference point at a predetermined position of the roll map bar corresponding to the data on the position of the electrode, and a display unit connected to the data processing system to display the roll map on a screen.

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which:

FIG. 1 is a schematic view illustrating a case in which distortion occurs in position coordinates when a loss occurs in an electrode in a state of no reference point;

FIG. 2 is a view illustrating a concept of the present disclosure of preventing the distortion of the position coordinates by introducing a reference point;

FIG. 3 is a schematic view of an electrode loss measuring apparatus according to one embodiment of the present disclosure;

FIG. 4 illustrates an example of measuring an electrode loss according to the present disclosure;

FIG. 5 illustrates another example of measuring the electrode loss according to the present disclosure;

FIG. 6 illustrates still another example of measuring the electrode loss according to the present disclosure;

FIG. 7 is a schematic view illustrating a change in a reference point by a roll press process;

FIG. 8 is a schematic view of an electrode loss measuring apparatus according to another embodiment of the present disclosure;

FIG. 9 illustrates an example of a roll map of an electrode process according to the present disclosure;

FIG. 10 is a schematic view of a system for generating the roll map of the electrode process according to the present disclosure; and FIG. 11 is a schematic view of a data visualization device for generating the roll map of the electrode process of the present disclosure.

DETAILED DESCRIPTION OF EXEMPLARY EMBODIMENTS

Hereinafter, the detailed configuration of the present disclosure will be described in detail with reference to the accompanying drawings and various embodiments. Embodiments described below are exemplary to assist in understanding of the present disclosure, and in order to help understand the present disclosure, the accompanying drawings are not shown to scale and the dimensions of some components may be exaggerated.

As the present disclosure allows for various changes and numerous forms, particular embodiments will be illustrated in the drawings and described in detail in the text. However, this is not intended to limit the present disclosure to the specific form disclosed, and it should be understood that the present disclosure encompasses all changes, equivalents, and substitutes within the spirit and scope of the present disclosure.

FIG. 1 is a schematic view illustrating a case in which distortion occurs in position coordinates on a roll map when a loss occurs in an electrode in a state of no reference point.

An upper drawing of FIG. 1 illustrates a roll map RM simulating the movement of an electrode moving in a roll-to-roll state between an unwinder UW and a rewinder RW. A plurality of pieces of detailed data related to quality and defects are visually displayed together on the actual roll map RM, but for convenience of description, in FIG. 1, only electrode breakage and a connection tape T are illustrated.

The roll map RM in the upper drawing of FIG. 1 simulates an actual electrode, and several types of breakage occur in the actual electrode. When one process of detailed processes of an electrode process is performed, electrode breakage occurs in the one process (current process), and breakages of 50 meters and 60 meters are displayed on the roll map RM. Further, it is displayed that 30 meters of a starting end portion of the electrode was removed in a preceding process, before entering the current process, and 35 meters of a finishing end portion of the electrode was removed in the current process.

In this case, when breakage portions or electrode removal portions (electrode loss portions) of the starting and finishing end portions of the electrode are removed, only the connection tape T connecting the breakage portions is left as shown in a lower drawing of FIG. 1. That is, an actual electrode form is shown in the lower drawing of FIG. 1. In the lower drawing of FIG. 1, for example, a position of the connection tape T may be detected by, for example, a seam detection sensor. However, since the broken electrode or the removed electrode does not remain in the actual electrode, a loss amount of the electrode (hereinafter, used interchangeably with “electrode loss”), which is a length of the electrode removal portion (loss portion), may not be identified. As described above, since an operator manually inputs information on the electrode removal portion, it is difficult to know the exact loss amount of the electrode.

Further, when the loss amount of the electrode is not identified, the roll map RM of the electrode process has the form as shown in the lower drawing of FIG. 1, and the position coordinates on the roll map are also distorted. In the upper drawing of FIG. 1, the breakage/removal length of the electrode is assumed to be known and thus displayed together with the connection tape for convenience of description, and thus, when an electrode loss actually occurs, the roll map has the form as shown in the lower drawing of FIG. 1.

That is, in the roll map RM, the movement of the electrode is simulated and a longitudinal dimension corresponding to a dimension of the electrode in a longitudinal direction, i.e., a position coordinate is displayed, and thus, when the loss amount of the electrode is not identified, the loss amount of the electrode may not be reflected in the longitudinal dimension. Accordingly, when the electrode is transferred to the subsequent process of the electrode process or another detailed process of the electrode process, it is difficult to use the roll map in which the loss amount of the electrode is not reflected. In other words, it is necessary to correct the position coordinate by displaying or reflecting the loss amount of the electrode in the roll map RM and also reflecting the loss amount of the electrode in the longitudinal dimension (position coordinate) of the roll map.

FIG. 2 is a view illustrating a concept of the present disclosure of preventing the coordinate distortion of the roll map RM by introducing a reference point.

In a roll map RM in a lowermost portion of FIG. 2, reference points M1, M2, and M3 are introduced at predetermined intervals, and an electrode loss portion is displayed. The number and interval of the reference points M1, M2, and M3 may be differently applied depending on the length or specifications of an electrode. In FIG. 2, an electrode having a length of 1200 meters is assumed, and the reference points M1, M2, and M3 are respectively displayed at points of 300 meters, 600 meters, and 900 meters. When the above-described reference points M1, M2, and M3 are marked on an actual electrode, and measured when an electrode loss occurs, an interval between the reference points is changed, and thus, the electrode loss may be easily identified on the basis of the changed value. As described above, when the electrode loss is identified, the reference points M1, M2, and M3 and an electrode loss length may be displayed together, as in the roll map RM in the lowermost portion of FIG. 2. As will be described below, a longitudinal dimension (absolute coordinate) of the electrode, in which the loss length is reflected, and a longitudinal dimension (relative coordinate) of the electrode, in which the loss length is not reflected, may be displayed together on one roll map.

As described above, when the reference points are introduced to the electrode, from the change in the interval between the reference points, the electrode loss may be identified by comparing positions of the reference points before the change (positions of set reference points) and positions of the measured reference points, and reflected on the roll map. The measurement of the electrode loss using the reference points will be described in detail.

Electrode Loss Measuring Apparatus and Method

First Embodiment

FIG. 3 is a schematic view of an electrode loss measuring apparatus 100 according to one embodiment of the present disclosure.

The electrode loss measuring apparatus 100 of the present disclosure includes an electrode 10 which is transferred between an unwinder UW and a rewinder RW in a roll-to-roll state and on which a plurality of reference points M1, M2, and M3 are marked at predetermined intervals between a starting end portion and a finishing end portion of the electrode 10, a reference point detector 20 configured to detect the reference points marked on the electrode, a position measurer 30 configured to derive a position value of the electrode according to a rotation amount of the unwinder UW or rewinder RW, and derive a position value of the corresponding reference point in conjunction with the reference point detector when the reference point detector detects the reference point, and a calculator 40 configured to calculate a loss amount of the electrode by comparing the derived position value of the reference point with a position value of a set reference point when an interval between the reference points between the starting and finishing end portions of the electrode is changed from an interval between the set reference points due to a loss of a portion of the electrode.

In the electrode loss measuring apparatus 100 of the present disclosure, the plurality of reference points M1, M2, and M3 are marked on the electrode 10 at predetermined intervals between the starting and finishing end portions of the electrode. As described above, the number and interval of the reference points may be differently applied according to the length or specifications of the electrode. The reference points may be marked by a predetermined reference point marker 60. For example, an inkjet-type ink marking printer may be used as the reference point marker. An electrode process includes a plurality of processes of a coating process, a roll press process, and a slitting process, and thus the marking needs to be firstly performed on the electrode before measuring an electrode loss. To this end, the reference point marker 60 may be installed before the unwinder UW in which the corresponding process is carried out, and may mark the plurality of reference points M1, M2, and M3 on the electrode at predetermined intervals. The marking of the reference points may not be performed on a coated portion 11 to which an active material of the electrode 10 is applied but may be performed on an uncoated portion 12, on which the active material is not applied, for visibility, and may be performed on an upper or lower surface or both the upper and lower surfaces of the uncoated portion (see FIG. 7).

Further, the present disclosure includes the reference point detector 20 configured to detect the reference points on the electrode. The reference point detector 20 may be an optical character recognition (OCR) reader capable of reading printed characters by OCR. Alternatively, a vision camera capable of detecting the reference points by including a vision sensor may be employed as the reference point detector. As shown in FIG. 3, the reference point detector may be installed above an electrode 10 line transferred in a roll-to-roll state.

The position measurer 30 may derive the position value of the electrode according to the rotation amount of the unwinder UW or the rewinder RW. For example, rotary encoders 30R and 30U that extract a position value of the electrode from rotation amounts of motors that respectively drive the unwinder UW and the rewinder RW may be used as the position measurer. The rotary encoders 30R and 30U may be installed in the unwinder UW and the rewinder RW, specifically, in motor drivers of the unwinder UW and the rewinder RW. Since the electrode unwound from the unwinder UW is wound around the rewinder RW, magnitudes of the position values of the electrode derived from the rotary encoders 30R and 30U respectively installed in the unwinder UW and the rewinder RW may have magnitudes with opposite signs. However, no matter which rotary encoder is used, the position of the electrode may be changed into a digital signal according to the rotation amount of the motor, and the position value may be derived as a numerical value. In the present disclosure, the position measurer 30 interworks with the reference point detector 20, and thus, when the reference point detector 20 detects the reference point, the position measurer 30 may derive a position value of the corresponding reference point. In FIG. 3, it is illustrated that the reference point detector 20 is connected to the position measurer 30 and the position measurer 30 automatically derives the position value of the reference point when the detected signal of the reference point detector is transmitted to the position measurer. The reference point detector may be connected to the position measurer in a wired or wireless manner.

The present disclosure includes the calculator 40 configured to calculate a loss amount of the electrode by comparing the derived position value of the reference point with the position value of the set reference point when the interval between the reference points between the starting and finishing end portions of the electrode is changed from the interval between the set reference points due to a loss of a portion of the electrode 10. The calculator 40 may be, for example, a controller (PCT controller) that controls transferring of the electrode between the unwinder UW and the rewinder RW. The calculator 40 may include a predetermined calculation program and calculate the loss amount of the electrode by comparing the position value of the reference point obtained by the position measurer 30 and the position value of the set reference point. To this end, the calculator 40 may include a memory in which the position value of the set reference point is stored, or may read data about the position value of the set reference point from a database.

As shown in FIGS. 1 and 2, when an electrode loss due to breakage or arbitrary removal of the electrode occurs, the position of the reference point is changed from the position of the initially marked reference point (the position value of the set reference point). Accordingly, the calculator 40 may calculate the loss amount of the electrode from the above fact. A detailed loss calculation process will be described in detail when an electrode loss measuring method of the present disclosure is described.

The electrode loss measuring apparatus 100 of the present disclosure further includes a seam detection sensor 50 configured to detect a connection tape attached to the electrode. The connection tape is a tape for connecting broken electrodes when breakage occurs in the electrode. When only the seam detection sensor 50 is installed without having the reference point, the seam detection sensor may identify that breakage is present in the electrode by detecting the connection tape. However, it is not possible to identify to what extent the length of the electrode is broken. As described above, in the present disclosure, the reference point detector 20, the position measurer 30, and the calculator 40 are provided, so that the length of the broken electrode may be identified.

Like the reference point detector 20, the position measurer 30 interworks with the seam detection sensor 50 and thus may derive a length of the connection tape when the connection tape is detected by the seam detection sensor 50. Specifically, the seam detection sensor 50 may detect each of a starting end portion and a finishing end portion of the connection tape, and when the position measurer 30 receives each detected signal, the position measurer may detect a position value at a time point of detecting the starting end portion and a position value at a time point of detecting the finishing end portion. Since a difference between the position value at the time point of detecting the starting end portion and the position value at the time point of detecting the finishing end portion becomes the length of the connection tape, the length of the connection tape may be identified by the position detection by the position measurer 30. The seam detection sensor 50 may be, for example, a color sensor. Since a color of the connection tape is different from that of a typical electrode, the connection tape, which is a part having a color different from that of the electrode, may be detected by the color sensor.

The connection tape may also include a polyethylene terephthalate (PET) film in addition to an adhesive tape that connects the electrodes. The PET film extends a relatively longer section than the adhesive tape and connects the electrodes.

When the connection tape is detected in addition to the reference point, the calculator 40 calculates a value obtained by adding the length of the connection tape to the loss amount calculated by comparing the position value of the reference point with the position value of the set reference point as a total loss amount. A detailed description thereof will be provided below.

An electrode loss calculation method of the present disclosure includes marking a plurality of reference points at predetermined intervals between a starting end portion and a finishing end portion of an electrode transferred in a roll-to-roll state between an unwinder UW and a rewinder RW, deriving a position value of the reference point by detecting the reference point on the electrode by a reference point detector 20, and calculating a loss amount of the electrode by comparing the derived position value of the reference point with a position value of a set reference point when an interval between the reference points between the starting and finishing end portions of the electrode is changed from an interval between the set reference points due to a loss of a portion of the electrode.

As described above, before detecting the reference points, the plurality of reference points are marked at predetermined intervals between the starting and finishing end portions of the electrode by a reference point marker 60 (see FIG. 3).

The reference point detector 20, such as a vision camera, may detect the reference point on the electrode, and the position value of the reference point may be derived by the position measurer 30 interworking with, for example, the reference point detector. When there is no loss in the electrode, the derived position value of the reference point may be the same as the position value of the set reference point.

However, when a length of the electrode becomes less than a length of the electrode originally wound around the unwinder UW due to breakage or arbitrary removal, the interval between the reference points between the starting and finishing end portions of the electrode is changed from the interval between the set reference points. With such a change, the loss amount of the electrode may be calculated by comparing the derived position value of the reference point with the position value of the set reference point.

Specifically, when at least one of the interval between the reference points, an interval between the reference point and the starting end portion of the electrode, and an interval between the reference point and the finishing end portion of the electrode is changed, the loss amount of the electrode may be calculated by comparing the derived position value of the reference point and the position value of the set reference point.

FIG. 4 illustrates an example of measuring the electrode loss according to the present disclosure.

FIG. 4A illustrates that three reference points M1, M2, and M3 are marked at an interval of 300 meters on an electrode in which no loss occurs. A length of the electrode is 1200 meters, and the rewinder RW and the unwinder UW are installed at a starting end portion and a finishing end portion of the electrode, respectively, and the electrode is transferred in a roll-to-roll state. For convenience of description, a side in which the electrode wound around the rewinder RW will be considered as the starting end portion of the electrode, a side in which the electrode is unwound from the unwinder UW is considered as the finishing end portion of the electrode, and the description is made on the basis that the electrode proceeds from the unwinder UW to the rewinder RW.

FIG. 4B illustrates a state in which an operator arbitrarily removed 100 meters of the electrode in the preceding process. In this case, a first reference point M1 of the electrode wound around the rewinder RW is pulled from 300 meters to 200 meters, which is detected by the reference point detector 20, and 200 meters, which is a position value of the first reference point M1 is derived by the rotary encoder installed in the rewinder RW. Since the starting end portion of the electrode is reduced by 100 meters, positions of the second and third reference points M2 and M3 are also changed from 600 meters to 500 meters and from 900 meters to 800 meters, respectively. In FIG. 4, the numbers indicated in italics mean the changed position values of the reference points. This is equally applied to the following description. In addition, the position of the finishing end portion of the electrode detected by the unwinder UW is also changed from 1200 meters to 1100 meters.

The position measurer 30 transmits pieces of data on the position values of the reference points changed as described above to the calculator 40, and the calculator 40 calculates the electrode loss by comparing the position values of the set reference points, which are 300, 600, and 900, with the derived position values of the reference points, which are 200, 500, and 800. Specifically, in FIG. 4B, since the interval between the starting end portion of the electrode and the first reference point M1 is reduced from 300 meters to 200 meters, the loss amount of the electrode may be calculated to be 100 meters. In addition, a loss occurrence position may also be specified between the starting end portion of the electrode and the first reference point M1. However, since the connection tape is not detected between the starting end portion of the electrode and the first reference point M1, it may be estimated that the loss is not due to electrode breakage. Of course, in order to detect the connection tape, the seam detection sensor 50 to be described below is required.

FIG. 5 illustrates another example of measuring the electrode loss according to the present disclosure.

In FIG. 5A, an electrode loss of 100 meters is generated at the finishing end portion of the electrode, in contrast to FIG. 4B. In this case, a change in the reference point is not identified in the position measurer 30R (the rotary encoder) installed in the rewinder RW.

However, the fact that the position of the finishing end portion is reduced by 100 meters may be identified by the rotary encoder 30U on the unwinder UW side, and from this fact, the calculator 40 may derive that an interval between the finishing end portion of the electrode and the third reference point M3 is reduced to 200 meters. Accordingly, the position of the third reference point M3 is changed from the position value of the set reference point on the basis of the position measurer 30U (the rotary encoder) of the unwinder UW, and from this fact, the calculator 40 may calculate that the finishing end portion of the electrode has a 100-meter electrode loss.

FIG. 5B illustrates that an electrode loss occurs in an intermediate portion rather than the starting end portion or the finishing end portion of the electrode. When a 100-meter electrode loss occurs between the first reference point M1 and the second reference point M2 due to, for example, electrode breakage, the position value of the first reference point M1 is not changed, but the positions of the second and third reference points M2 and M3 and the finishing end portion of the electrode are changed. When the position value of the reference point, which is changed due to such a change in the reference point, is derived by the reference point detector 20 and the position measurer 30 interworking with the reference point detector 20, the derived position value of the reference point is compared with the position value of the set reference point, thereby calculating that the loss amount of the electrode between the first reference point and the second reference point is 100 meters.

Thus, according to the electrode loss measuring method of the present disclosure, when at least one of the interval between the reference points, the interval between the reference point and the starting end portion of the electrode, and the interval between the reference point and the finishing end portion of the electrode is changed, the loss amount of the electrode may be calculated by comparing the derived position value of the reference point and the position value of the set reference point.

FIG. 6 illustrates still another example of measuring the electrode loss according to the present disclosure.

The present example illustrates a case in which the connection tape T is present on the electrode due to electrode breakage. In this case, it is detected by the reference point detector 20 and the position measurer 30 that the second and third reference points M2 and M3 are changed from 600 meters to 550 meters and from 900 meters to 850 meters, respectively. From this fact, it is first assumed that there was a 50-meter electrode loss between the first reference point M1 and the second reference point M2.

In addition, the length of the connection tape T is detected to be 50 meters by the seam detection sensor 50 and the position measurer 30. This means that the electrode broken due to electrode breakage was cut off and the broken electrodes were connected with the connection tape T having a length of 50 meters. Accordingly, an actual breakage amount of the electrode is obtained by adding the 50 meter length of the connection tape T to the above 50 meters. That is, when the position value of the reference point is compared with the position value of the set reference point, the calculator 40 calculates a value obtained by adding the length of the connection tape T to the loss amount, which is calculated by comparing the position value of the reference point with the position value of the set reference point, as a total loss amount.

The calculating of the length of the connection tape may be performed before or after the deriving of the position value of the reference point. For example, when the reference point detector 20 is installed before the seam detection sensor 50, the length of the connection tape may be calculated after deriving the position value of the reference point, and when the seam detection sensor 50 is installed before the reference point detector 20, the calculating of the length of the connection tape may be performed first.

Second Embodiment

FIG. 7 is a schematic view illustrating a change in a reference point by a roll press process.

As described above, an electrode process includes an electrode coating process of coating a current collector with an electrode slurry, a roll press process of rolling the coated electrode by a press roll, and a slitting process of cutting the rolled electrode in a longitudinal direction.

For example, when the roll press process is performed after the reference point is marked in the electrode coating process, the electrode is stretched at a predetermined rate. A lower drawing of FIG. 7 illustrates the stretching of an electrode 10. When the electrode 10 is stretched, reference points M1, M2, and M2 are also stretched at a predetermined rate. When a position of the reference point is changed, in the processes after the rolling, a loss amount of the electrode needs to be calculated on the basis of the changed reference point. That is, in the electrode coating process, the loss amount of the electrode is calculated on the basis of original first to third reference points M1, M2, and M3, but after the rolling, the loss amount of the electrode should be calculated on the basis of changed first to third reference points M1', M2', and M3'. At this time, for the reference points M1', M2', and M3' changed by the rolling, data on position values of set reference points related to the changed reference points is also stored in a database or a memory. Accordingly, when a loss occurs in the electrode after the roll press process, it is possible to determine the loss amount in comparison with the data on the set value based on the changed reference point. The position value of the set reference point in which the rolling is reflected is preset according to a roll press pressure, an electrode elongation length, and the like, and is stored in the database or the like.

FIG. 8 is a schematic view of an electrode loss measuring apparatus 200 according to another embodiment of the present disclosure.

The present embodiment illustrates a roll press procedure in which an electrode 10, which has undergone an electrode coating process is wound around an unwinder UW of a roll press process and transferred to a rewinder RW. In the present embodiment, a press roll R for rolling installed above and below a middle portion of the electrode transferred in a roll-to-roll state is provided. Thus, the electrode is stretched after being rolled by the press roll R, and thus reference points on the electrode are changed. In this case, positions of the reference point before and after the press roll R may be different from each other, and thus a first reference point detector 20A may be disposed before the press roll, and a second reference point detector 20B configured to detect the reference point, which is changed by the rolling by the press roll R, may be disposed after the press roll.

Accordingly, a calculator 40 may calculate a loss amount of the electrode before the press roll on the basis of a position value of the reference point detected by the first reference point detector 20A, and calculate a loss amount of the electrode after the rolling by the press roll R on the basis of a position value of the changed reference point detected by the second reference point detector 20B. In the present embodiment, a process of comparing the derived position value of the reference point with the position value of the set reference point is the same as that of the first embodiment, except that the position value of the reference point or an interval between the reference points is changed by rolling, and thus a detailed description of the calculation of the loss amount of the electrode is omitted in the present embodiment.

The embodiment of FIG. 8 illustrates that the reference point is changed in one process, but when the electrode is rolled by the press roll R and thus the position of the reference point is changed, the electrode loss measuring method that calculates the loss amount of the rolled electrode on the basis of the changed reference point is applied even after the rolling process. For example, even when the electrode roll is separated from the rewinder RW after the rolling process of FIG. 8, and the electrode roll is wound around the unwinder UW of the slitting process, which is a subsequent process, and the slitting process is performed as shown in FIG. 7, the loss amount of the electrode in the slitting process is calculated on the basis of the changed reference point. Of course, in the electrode coating process before the process of FIG. 8, the loss amount of the electrode is calculated on the basis of the reference point before the rolling.

As described above, according to the present disclosure, the loss amount of the electrode may be automatically and accurately calculated by a predetermined electrode loss measuring apparatus using a reference point. Accordingly, the reliability of the electrode loss data may be improved, and such data information may be effectively utilized in a subsequent process.

Further, according to the present disclosure, as will be described below, the reference point may be displayed on the roll map simulating the electrode and information on the electrode loss may also be displayed on the roll map, so that data related to quality or defects may be visually and easily grasped at a glance in relation to the reference point.

<Roll Map of Electrode Process>

FIG. 9 illustrates an example of the roll map of the electrode process according to the present disclosure.

A roll map 300 of the present disclosure includes a roll map bar 310 which is displayed on a screen in synchronization with the movement of an electrode moving in a roll-to-roll state between an unwinder UW and a rewinder RW and is displayed in a bar shape by simulating the electrode in a roll-to-roll state, and a plurality of reference points M1, M2, and M3 displayed on the roll map bar at predetermined intervals by simulating a plurality of reference points marked at predetermined intervals between a starting end portion and a finishing end portion of the electrode.

The roll map 300 of the electrode coating process of the present disclosure includes the roll map bar 310 that is displayed in a bar shape by simulating the electrode in a roll-to-roll state. Since the roll map bar 310 simulates an actual electrode that is installed and moved in a roll-to-roll state between the unwinder UW and the rewinder RW, a starting point and a finishing point of the roll map bar 310 and a portion of the roll map bar 310 between the starting point and the finishing point are displayed on the screen in synchronization with an electrode path moving between the unwinder UW and the rewinder RW. For example, when a length of an electrode roll to be coated is 3000 m, the roll map bar 310 simulating the electrode (roll) is reduced to a predetermined scale (ratio) with respect to 3000 m and displayed on the screen. In addition, when a specific electrode roll is installed between the unwinder UW and the rewinder RW, detailed information such as a lot number and a width of the electrode roll may also be identified, and thus, in addition to the length of the electrode (roll), the width thereof may be reduced to a predetermined scale, and the roll map bar 310 reduced to the length and width of the predetermined ratio may be displayed on the screen. Accordingly, the length and width of the roll map bar 310 correspond to the length and width of the actual moving electrode at a predetermined ratio. In addition, when a specific position of the electrode is represented by coordinates expressed in units of dimensions of, for example, the length and width of the electrode, the corresponding coordinates may also be displayed on the roll map bar 310 by being reduced to a predetermined ratio. In FIG. 9, a longitudinal dimension (dimension in 100 m increments) 320 of the electrode is displayed at predetermined intervals in a longitudinal direction of the roll map bar 310.

The roll map of the electrode process of the present disclosure includes the plurality of reference points M1, M2, and M3 displayed on the roll map bar at predetermined intervals by simulating a plurality of reference points marked at predetermined intervals between the starting and finishing end portions of the electrode. That is, as shown in FIG. 9, the reference points M1, M2, and M3 may be displayed on the roll map bar 310 at the predetermined scale ratio by simulating the reference points, which are actually marked on the electrode, on the roll map bar 310.

In this case, the reference points M1, M2, and M3 may also be expressed by the longitudinal dimension of the electrode.

A loss amount measured according to the electrode loss measuring apparatus and method using a reference point may also be displayed on the roll map 300 of the present disclosure. That is, a position coordinate (position data) in which the loss amount is reflected and a position coordinate in which the loss amount is not reflected may be displayed on one roll map. Referring to FIG. 9, a position coordinate 320 (longitudinal dimension) in which the loss amount of the electrode is not reflected is displayed as an absolute coordinate 321. In addition, the position coordinate 320 in which the loss amount of the electrode is reflected is displayed as a relative coordinate 322. Accordingly, referring to the roll map 300 of the present disclosure, the electrode loss in the preceding process or the current process may be grasped at a glance. In addition, since the coordinate in which the loss amount of the electrode is reflected and the coordinate in which the loss amount of the electrode is not reflected are simultaneously displayed, when a subsequent process is performed with reference to the roll map of the preceding process, distortion does not occur in the coordinates, and accordingly, the subsequent process may be accurately performed at a desired position.

Further, the roll map 300 further includes a representation part 330 in which at least one of pieces of data related to quality, defects, and an electrode loss measured in the electrode process is displayed and which is visually displayed at a predetermined position on the roll map bar 310 corresponding to a position of the electrode, at which the at least one of pieces of data is measured. Referring to FIG. 9, data 331 on quality (e.g., data on an electrode loading amount) of the electrode, data 332 on a defect (e.g., defect data such as a pinhole, a line, or the like), and data 333 on an electrode loss (data on an outermost waste section) are all displayed on the roll map bar 310. From the above fact, information on the quality, defect, and electrode loss of the electrode in the current process may be grasped at a glance. In practice, in addition to the outermost discard section, the electrode in which the defect is generated and the electrode that did not satisfy a quality standard are deleted and connected with a connection tape T or the like, and thus, an electrode loss is also generated in these portions. In the roll map 300, all of these electrode losses are reflected using the relative coordinate 322. Accordingly, by comparing the relative coordinate 322 and the absolute coordinate 321 of the roll map 300, an electrode loss length may be identified. At this time, referring to the reference points M1, M2, and M3 displayed on the roll map, the loss amount of the electrode may be more easily calculated.

For reference, on the screen on which the roll map 300 of FIG. 9 is displayed, items related to the quality, the defect, and the electrode loss are displayed at the top of the roll map. Accordingly, by referring to these items and the roll map, visual data related to the items may be easily grasped.

Meanwhile, the roll map 300 of FIG. 9 is a roll map in the electrode coating process, but the roll map may be generated for each of the roll press process and the slitting process. In this case, it is possible to easily identify an event or the like occurring in each process by comparing the roll map of each process. In addition, the roll map of the preceding process may be referenced and used when generating a roll map of the subsequent process. At this time, in the roll map of the process after the rolling by the press roll, a reference point simulating the position of the reference point changed by the rolling should be displayed on the roll map bar. That is, as shown in FIGS. 7 and 8, when the position of the reference point is changed by the rolling process, in the roll map of the roll press process and the subsequent slitting process, distortion may be prevented from occurring in the position coordinate of the roll map when the changed position of the reference point is simulated and displayed on the roll map bar.

<System and Method for Generating Roll Map of Electrode Process>

The present disclosure also provides a method and system for generating the roll map of the electrode process.

The method of generating the roll map of the electrode process of the present disclosure includes acquiring data on an electrode loss and data on a reference point marked on the electrode by inspecting an electrode 10 moving in a roll-to-roll state between an unwinder UW and a rewinder RW, transmitting the acquired data to a data processing system 420 together with data on a position of the electrode at which the corresponding data is acquired, and displaying a roll map bar in the form of a bar simulating the electrode in a roll-to-roll state on a screen in synchronization with a movement of the electrode between the unwinder UW and the rewinder RW and visually displaying the data on the electrode loss and the data on the reference point at a predetermined position on the roll map bar corresponding to the data on the position of the electrode, by the data processing system 420.

Further, a system 400 for generating the roll map of the electrode process of the present disclosure includes a measuring device 410 configured to inspect an electrode 10 moving in a roll-to-roll state between an unwinder UW and a rewinder RW, acquire data on an electrode loss and data on a reference point marked on the electrode, and transmit the data to a data processing system 420 together with the a data on a position of the electrode, at which the corresponding data is acquired, the data processing system 420 configured to generate a roll map by displaying a roll map bar in the form of a bar simulating the electrode in a roll-to-roll state in synchronization with the movement of the electrode between the unwinder UW and the rewinder RW and visually displaying the transmitted data on the electrode loss and the data on the reference point at a predetermined position on the roll map bar corresponding to the data on the position of the electrode, and a display unit 430 connected to the data processing system 420 to display the roll map on a screen.

FIG. 10 is a schematic view of the system 400 for generating the roll map of the electrode process according to the present disclosure, and FIG. 11 is a schematic view of a data visualization device 423 for generating the roll map of the electrode process according to the present disclosure.

Hereinafter, a method and system for generating a roll map will be described with reference to FIGS. 10 and 11.

In a method of generating a roll map of an electrode coating process of the present disclosure, an electrode moving in a roll-to-roll state between an unwinder UW and a rewinder RW is inspected to acquire data on an electrode loss and data on a reference point marked on the electrode.

For convenience of description, in FIG. 10, a state in which a current collector is coated with an electrode active material by a coater C in the electrode coating process to manufacture the electrode and a state in which the electrode is rolled by a press roll R are displayed together on one electrode line between the unwinder UW and the rewinder RW.

However, as described above, in practice, the electrode coating is performed on a separate unwinder UW and a separate rewinder RW, and at this time, a separate reference point detector and a separate seam detection sensor are installed to generate the roll map of the electrode coating process in the corresponding process. When the electrode coating process is completed, an electrode roll moves from the rewinder RW of the electrode coating process to the unwinder UW of the roll press process.

However, since FIG. 9 is for comprehensively describing a process of generating the roll map of the electrode process, unlike the actual process, the coater C of the electrode coating and the press roll R of the roll press process are shown on one electrode only for convenience of description. That is, when the coater C is removed from FIG. 9, it is a system for generating the roll map of the roll press process, and when the press roll R is removed, it is a system for generating the roll map of the electrode coating process, and thus, it should be understood that the electrode process does not actually proceed as in FIG. 9.

When an electrode roll is installed in a roll-to-roll state between the unwinder UW and the rewinder RW before the electrode coating process, a process of registering information on the electrode roll, in which detailed data including a lot number of the electrode roll is input to a server or a data processing system 420, may be performed first. For example, when the electrode roll is introduced onto the unwinder UW or between the unwinder UW and the rewinder RW, the detailed data including the lot number of the electrode roll may be input to the server or the like. When the information on the electrode roll is registered, detailed data on the electrode (roll), such as the lot number, a process, equipment, or the like may be retrieved from the server and displayed on the screen together with the roll map bar. In addition, specifications on a length and a width of the electrode roll may be identified from the detailed data on the electrode roll, and thus, a shape and a size of the roll map bar may be determined at a predetermined scale proportional to the length and width of the electrode when the roll map bar is generated by the data processing system 420 such as, for example, an MES. That is, according to a conversion scale stored in an MES or like, the shape and size of the roll map bar corresponding to the length and width of the electrode roll may be displayed on the screen. The data processing system refers to a system (including hardware or software) that performs input, processing, output, communication, or the like to conduct a series of manipulations on data. An example of such a data processing system may include an MES or the like as described above.

Meanwhile, in order to generate the roll map of the present disclosure, data on the electrode loss in the electrode process and data on the reference point marked on the electrode should be acquired, and data on the position of the electrode, at which the data is acquired, should be present. In addition, as necessary, data on quality or defects may also be acquired.

Such data may be obtained by inspecting the electrode 10 moving in the electrode process.

The electrode 10 is inspected by a predetermined measurer 410 installed on an electrode transfer line after coating or after rolling. For example, measurers such as an electrode slurry loading amount measurer 411, a dimension and width measurer 412, and an appearance inspector 413 may be installed on the line. As the electrode slurry loading amount measurer 411, a non-contact type thickness measuring sensor such as an ultrasonic sensor, a displacement sensor, a laser sensor, a confocal thickness sensor, or the like may be employed. Since a thickness of an electrode foil is known, for example, in the case of a confocal thickness sensor, a slurry loading amount may be measured by analyzing a wavelength of reflected light emitted from the sensor and calculating a distance (thickness) between the sensor and the electrode.

The dimension and width measurer 412 may employ a kind of vision measurer capable of measuring or scanning the appearance of a coated electrode to measure a width of the electrode, a width of a coated portion, and a width of an uncoated portion. When the widths of the coated portion and the uncoated portion are identified, a mismatch between the coated portion and the uncoated portion may also be identified.

The appearance inspector 413 may capture an appearance image by capturing an appearance of the electrode. From this, data on an appearance defect such as a pinhole, a line, and a differentiation sphere shape may be obtained, and data on an insulation appearance or an insulation defect may also be acquired. The appearance inspector 413 may include a sensor capable of determining a color of an electrode, for example, an inspector having a color sensor. By the color sensor, a part that has a different color from the electrode, such as a connection tape or PET film, may be detected.

The vision measurer may acquire data on the reference point marked on the electrode as described above, and may interwork with the position measurer 30 installed in the unwinder UW, the rewinder RW, or the like to detect a position value of the reference point and transmit the position value to the data processing system 420. Here, the above-described calculator 40 related to the measurement of the loss amount of the electrode may be the data processing system 420. That is, the system 400 of FIG. 10 may also measure an electrode loss. Data on the acquired electrode loss and data on the reference point may be transmitted to the data processing system 420 directly from the rotary encoder 30, which is a position measurer, or through the measuring device 410.

As described above, when pieces of data are acquired by various measurers, the pieces of data are transmitted to the data processing system 420. In this case, a server may be applied for data storage, although not shown in the drawing. Alternatively, the data processing system 420 may include a predetermined storage device to store the data.

In order to display the data on the electrode loss, the data on the reference point, or the data on the quality or defects on the roll map, data on the position of the electrode, at which the data is acquired, should be specified. That is, when it is assumed that the roll map bar is a coordinate system composed of two coordinate axes in a longitudinal direction and a width direction, in order to input (display) the specified data to a specific position (coordinate) of the coordinate system, the data on the position of the electrode, which is a basis for extracting the position (coordinate), should be identified.

The data on the position of the electrode in the longitudinal direction may be detected by a rotary encoder 30U or 30R installed in the unwinder UW or the rewinder RW. In general, the rotary encoder 30U or 30R may be installed in a motor driver that drives the unwinder UW or the rewinder RW, and may detect a moving distance of the electrode according to the number of revolutions of a motor. Accordingly, when the electrode moves between the unwinder UW and the rewinder RW, the moving distance may be detected by the rotary encoder 30U or 30R. In this case, when the rotary encoder 30R of the rewinder RW is allowed to interwork with or perform data communication in a wired or wireless manner with the appearance inspector 413, the appearance inspector 413 may acquire the data on the position in the longitudinal direction detected by the encoder 30R of the rewinder RW. As shown in FIG. 10, the encoder of the rewinder RW is connected to the electrode slurry loading amount measurer 411 and the dimension and width measurer 412 so as to exchange data therewith, in addition to the appearance inspector, and may acquire the data on the position of the electrode in the longitudinal direction, at which the loading amount is measured, and data on the position of the electrode in the longitudinal direction, at which the dimension or width is measured, together with the information on the loading amount and the dimension/width. As necessary, the encoder 30U of the unwinder UW may also be connected to the various measurers 410.

Meanwhile, the data on the position of the electrode in the width direction may be detected, for example, by the predetermined measurer 410 for inspecting the electrode process. The measurer 410, such as the electrode slurry loading amount measurer shown in FIG. 10, may be installed as a plurality of measurers along the width direction of the electrode or may be installed along the width direction of the electrode so as to be movable. Accordingly, the measurers 410 may acquire data (e.g., data on a loading amount or appearance defect) for each point in the width direction of the electrode at regular intervals, and also, the data on the position in the width direction, which is data in the current process, may also be acquired by the measurers 410. Since each measurer 410 and the encoder 30U or 30R of the unwinder UW or the rewinder RW are connected so as to enable data communication between each other, the data on the positions in the longitudinal and width directions, at which the data is acquired, may both be acquired.

As shown in FIG. 10, the pieces of data are sent to the data processing system, such as an MES 420. The MES 420 refers to software for managing production such that cost reduction, quality management, and low-cost and high-efficiency production are possible on the basis of factory data in the manufacturing field, or the data processing system 420 including the software. In the embodiment described in FIG. 10, a database 421 is installed in the MES 420. However, the database 421 may be provided separately from the MES 420. Various pieces of data related to product production in the factory are stored in the database 421. In addition, regarding the generation of the roll map of the present disclosure, the database 421 includes the data on the electrode loss, the data on the reference point, and the like in the electrode process. A quality managing unit or central processing unit 422 of the MES 420 may determine whether the data acquired by the measurer or the like has deviated from normal quality data by comparing the acquired data with quality data of the database 421. When the acquired data deviates from the normal quality data, the acquired data may be marked on the roll map bar by varying colors or shapes so as to be visually distinguished from other portions.

Meanwhile, the data on the electrode loss and the data on the reference point marked on the electrode are visually displayed as the roll map on the display unit 430 by the data visualization device 423 installed in the MES 420 together with other pieces of data related to quality or defects.

FIG. 11 is a schematic view of the data visualization device 423 for generating the roll map of the electrode process of the present disclosure.

As illustrated in the drawing, the data visualization device 423 includes an acquisition data input unit 423_a_, a coordinate-on-roll-map-bar recognition unit 423_b_, and an image generation unit 423_c_.

First, the acquisition data input unit 423_a_ receives data from a server or the quality managing unit or central processing unit 422.

The coordinate-on-roll-map-bar recognition unit 423_b_ may define a visualization region in which a roll map is to be formed, and define pixel coordinate values in the visualization region with respect to each data element of the acquired raw data. In this case, when data related to specifications, such as a lot number, a length, a width, and the like, of the electrode roll is input to the MES 420 by the registration of the information on the electrode roll, the coordinate-on-roll-map-bar recognition unit 423_b_ may calculate and determine the visualization region of the roll map bar from the data on the size of the electrode according to a predetermined conversion scale. Alternatively, the visualization region of the roll map bar may also be calculated and determined from the data related to the positions of the electrode in the longitudinal and width directions according to a predetermined conversion scale.

The coordinate recognition unit 423_b_ may map the acquired data and the data on the positions (of the width and longitudinal directions) of the electrode, and may allocate the pieces of mapped data to the visualization region (roll map bar) according to the pixel coordinates.

The image generation unit 423_c_ may express a mapped data element allocated to each pixel coordinate in the visualization region with at least one legend. The legend means various shapes, such as a circle, a quadrangular shape, a triangular shape, and the like displayed in the visualization region, or the shapes to which colors are assigned. Accordingly, in the visualization region that is called the roll map bar, various pieces of data are implemented on the roll map bar by the image generation unit 423_c_ by being visually displayed in the pixel coordinate (coordinate of the roll map bar), which corresponds to the data on each position of the actual electrode, as the display portion having a shape and a color designated for each data, thereby generating the roll map of the present disclosure.

By using various conventional user interfaces or various programs or processing tools related to data allocation-processing-analysis and visualization, the size of the visualization region may be set, or an image may be generated by identifying the coordinates of the visualization region. Accordingly, the above-described method of generating the roll map is only exemplary, and is not limited to the above-described embodiment.

As described above, according to the present disclosure, a reference point may be displayed on a roll map simulating an electrode, and information on an electrode loss may also be displayed on the roll map, so that data related to quality or defects may be visually and easily grasped at a glance in relation to the reference point.

Further, in each detailed process of an electrode process, the roll map where the above reference points are displayed may be referenced for quality, defect management, and subsequent processing, so that processing or defect removal in the subsequent process may be accurately performed.

In an electrode process according to the present disclosure, a loss amount and position of an electrode can be accurately identified using a reference point. In addition, the loss amount of the electrode is automatically and accurately measured without relying on the naked eye or feeling of an operator, so that the reliability of loss amount data can be improved, and information on such data can be effectively utilized in a subsequent process.

Further, according to the present disclosure, the reference point can be displayed on a roll map simulating an electrode, and information on a loss amount of the electrode can also be displayed on the roll map, so that data related to quality or defects can be visually and easily grasped at a glance in relation to the reference point.

Further, in each detailed process of an electrode process, the roll map on which the reference points are displayed can be referenced for quality, defect management, and subsequent processing, so that processing or defect removal in the subsequent process can be accurately performed.

In the above, the present disclosure has been described in more detail through the drawings and embodiments. However, the embodiments described in the specification and the configurations described in the drawings are only the most preferred embodiments of the present disclosure, and do not represent all of the technical ideas of the present disclosure. It is to be understood that there may be various equivalents and variations in place of them at the time of filing the present application.

What is claimed is:

1. An electrode loss measuring method comprising:

marking a plurality of reference points between a starting end portion and a finishing end portion of an electrode moving in a roll-to-roll state between an unwinder and a rewinder at predetermined intervals;

deriving a position value of a reference point by detecting the reference point on the electrode using a reference point detector; and calculating a loss amount of the electrode by comparing the derived position value of the reference point with a position value of a set reference point when an interval between the plurality of reference points is changed from an interval between set reference points due to a loss of a portion of the electrode.

2. The electrode loss measuring method of claim 1, wherein the calculating the loss amount of the electrode further includes comparing the derived position value of the reference point and the position value of the set reference point when at least one is changed of the group comprising: the interval between the plurality of reference points;

an interval between the reference point and the starting end portion of the electrode; and an interval between the reference point and the finishing end portion of the electrode.

3. The electrode loss measuring method of claim 1, wherein the calculating the loss amount of the electrode further includes calculating a value obtained by adding a length of a connection tape to the loss amount calculated by comparing the position value of the reference point with the position value of the set reference point.

4. The electrode loss measuring method of claim 1, wherein the calculating the loss amount of the electrode is based on the reference points having a changed position when the electrode is press rolled.

5. The electrode loss measuring method of claim 1, wherein the marking the plurality of reference points further includes marking the plurality of reference points before the electrode is transferred to moving in the roll-to-roll state between the unwinder and the rewinder.

6. The electrode loss measuring method of claim 1, wherein the marking the plurality of reference points further includes marking the plurality of reference points on a portion of the electrode not coated with an active material.

7. The electrode loss measuring method of claim 1, wherein the deriving is based a rotation amount of a motor driving the unwinder or the rewinder.

8. The electrode loss measuring method of claim 1, wherein the electrode comprises a middle portion above which and below which a press roll for rolling is installed, wherein the electrode loss measuring method further comprises calculating a loss amount of the electrode before a rolling of the press roll on the basis of a position value of a reference point detected before the rolling of the press roll, and calculating a loss amount of the electrode after the rolling by the press roll on the basis of the position value of the reference point changed and detected after the rolling of the press roll.

9. The electrode loss measuring method of claim 1, further comprising:

displaying a roll map on a screen corresponding to movement of the electrode moving in the roll-to-roll state between the unwinder and the rewinder by simulating the electrode in the roll-to-roll state; and displaying a plurality of reference points on the roll map bar at predetermined intervals by simulating the plurality of reference points marked between the starting end portion and the finishing end portion of the electrode at predetermined intervals.

10. The electrode loss measuring method of claim 9, further comprises displaying a longitudinal dimension of the electrode in a longitudinal direction of the roll map, wherein the displayed reference points are displayed along the longitudinal dimension.

11. The electrode loss measuring method of claim 10, further comprises displaying the longitudinal dimension of the electrode both as an absolute coordinate in which an electrode loss is not reflected and as a relative coordinate in which the electrode loss is reflected.

12. The electrode loss measuring method of claim 10, further comprises displaying at a predetermined position on the roll map corresponding to a position of the electrode, a representation part corresponding to at least one piece of data related to quality, defects, and the calculated loss amount of electrode loss.

* * * * *